(12) United States Patent
Peng

(10) Patent No.: US 8,803,429 B2
(45) Date of Patent: Aug. 12, 2014

(54) STRUCTURE OF LED LIGHT COLOR MIXING CIRCUIT

(71) Applicant: Mei-Ling Peng, Hsinchu (TW)

(72) Inventor: Mei-Ling Peng, Hsinchu (TW)

(*) Notice: Subject to any disclaimer, the term of this patent is extended or adjusted under 35 U.S.C. 154(b) by 0 days.

(21) Appl. No.: 13/691,847

(22) Filed: Dec. 3, 2012

(65) Prior Publication Data

US 2014/0151727 A1   Jun. 5, 2014

(51) Int. Cl.
*H05B 37/00* (2006.01)
*H01L 33/62* (2010.01)

(52) U.S. Cl.
CPC .................................... *H01L 33/62* (2013.01)
USPC ...................................... 315/185 R; 315/312

(58) Field of Classification Search
USPC ............... 315/291, 312, 185 R, 185 S, 209 R
See application file for complete search history.

(56) References Cited

U.S. PATENT DOCUMENTS

| | | | |
|---|---|---|---|
| 6,288,497 B1* | 9/2001 | Chang et al. | 315/185 R |
| 2004/0075399 A1* | 4/2004 | Hall | 315/291 |
| 2004/0080941 A1* | 4/2004 | Jiang et al. | 362/252 |
| 2006/0038542 A1* | 2/2006 | Park et al. | 323/229 |
| 2012/0206065 A1* | 8/2012 | Whitaker et al. | 315/312 |

* cited by examiner

*Primary Examiner* — Minh D A
(74) *Attorney, Agent, or Firm* — Leong C. Lei

(57) ABSTRACT

The present invention provides a structure of color mixing circuit of LED light. The LED light includes two input terminals and two output terminals. The two input terminals are respectively an input terminal of reverse parallel connection of any two light-emitting chips of three primary-color light-emitting chips of R, G, B and an anode input terminal of the remaining light-emitting chip and the two output terminals are respectively an output terminal of reverse parallel connection of any two light-emitting chips of the three primary-color light-emitting chips of R, G, B and a cathode output terminal of the remaining light-emitting chip. The structure is simple and the purposes of reducing the number of IC control chips and synchronous color change of light-emitting chips are achieved with modification only made on electrical connection among the three primary-color light-emitting chips in realizing operation of a group of LED lights connected in series.

7 Claims, 1 Drawing Sheet

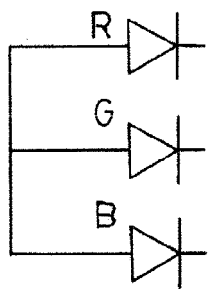
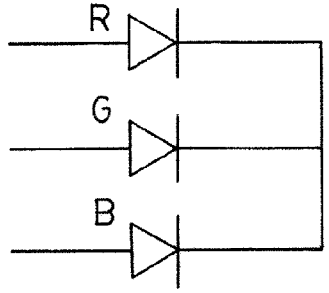
FIG.1
PRIOR ART
FIG.2
PRIOR ART
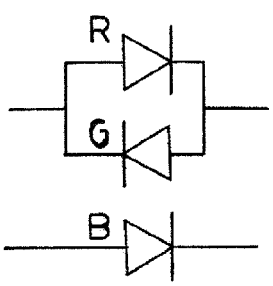
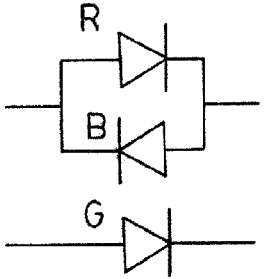
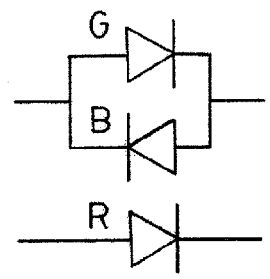
FIG.3  FIG.4  FIG.5
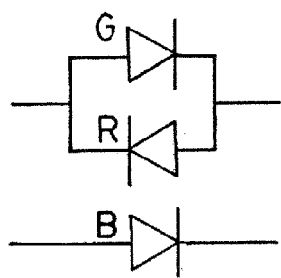
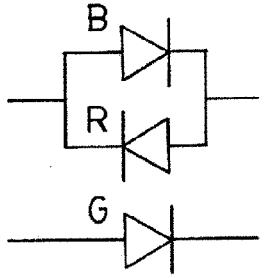
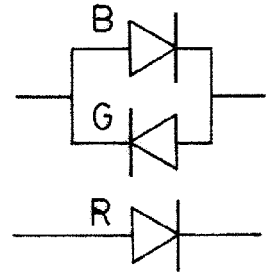
FIG.6  FIG.7  FIG.8
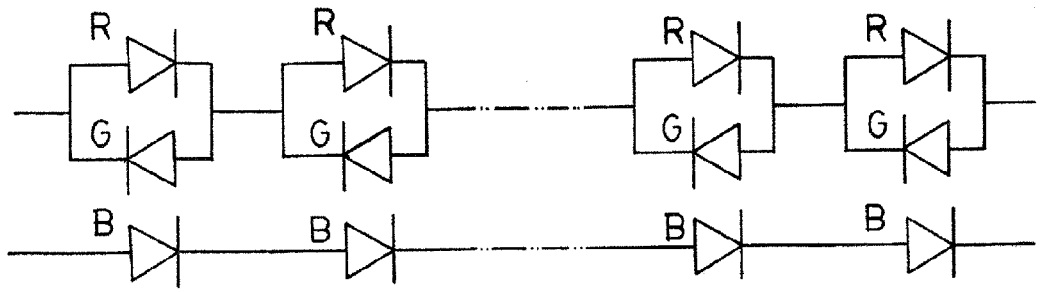
FIG.9

STRUCTURE OF LED LIGHT COLOR MIXING CIRCUIT

TECHNICAL FIELD OF THE INVENTION

The present invention generally relates to a structure of electrical connection of light-emitting chips of an LED light, and more particularly to a structure electrical connection of three primary-color light-emitting chips of R, G, B of an LED light.

DESCRIPTION OF THE PRIOR ART

In the known technology of LED lights comprising color light-emitting chips, the structure of electrical connection of the three primary-color light-emitting chips of R, G, B of the LED light is generally a parallel connection structure with a common cathode or a common anode, as shown in FIGS. 1 and 2. Sometimes, a group of LED lights are used in series connection, such as a light bar or a color light string. The known technology is disadvantageous in that synchronous color change is not possible for the primary-color light-emitting chips when the LED light string in used in series connection. The electrical connection structure of primary-color light-emitting chips of a conventional LED light uses three ICs to individually control the three primary-color light-emitting chips of R, G, B colors and the manufacturing cost is thus increased.

SUMMARY OF THE INVENTION

In order to overcome the drawbacks of the known technology that synchronous color change of primary-color light-emitting chips cannot be effected for the conventional LED lights used in series connection and manufacturing cost is increased resulting from three ICs being used to individually control the three primary-color light-emitting chips of R, G, B in an electrical connection of the primary-color light-emitting chips of a conventional LED light, the present invention provides a structure of electrical connection of light-emitting chips of an LED light, which achieves the purposes of reducing the number of IC control chips used and realizing synchronous color change of light-emitting chips.

The technical solution adopted in the present invention is that in an LED light that comprises three primary-color light-emitting chips of R, G, B, the LED light comprises two input terminals and two output terminals, wherein the two input terminals are respectively an input terminal of reverse parallel connection of any two light-emitting chips of the three primary-color light-emitting chips of R, G, B and an anode input terminal of the remaining light-emitting chip and the two output terminals are respectively an output terminal of reverse parallel connection of any two light-emitting chips of the three primary-color light-emitting chips of R, G, B and a cathode output terminal of the remaining light-emitting chip.

The advantage of the present invention is that the structure is simple and the purposes of reducing the number of IC control chips and synchronous color change of light-emitting chips can be achieved with modification only made on electrical connection among the three primary-color light-emitting chips of R, G, B in realizing operation of a group of LED lights connected in series.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 1 is a view illustrating common anode connection of three primary-color light-emitting chips of R, G, B of a conventional LED light.

FIG. 2 is a view illustrating common cathode connection of three primary-color light-emitting chips of R, G, B of a conventional LED light.

FIG. 3 is a view illustrating a connection arrangement of three primary-color light-emitting chips of R, G, B according to a first embodiment of the present invention.

FIG. 4 is a view illustrating a connection arrangement of three primary-color light-emitting chips of R, G, B according to a second embodiment of the present invention.

FIG. 5 is a view illustrating a connection arrangement of three primary-color light-emitting chips of R, G, B according to a third embodiment of the present invention.

FIG. 6 is a view illustrating a connection arrangement of three primary-color light-emitting chips of R, G, B according to a fourth embodiment of the present invention.

FIG. 7 is a view illustrating a connection arrangement of three primary-color light-emitting chips of R, G, B according to a fifth embodiment of the present invention.

FIG. 8 is a view illustrating a connection arrangement of three primary-color light-emitting chips of R, G, B according to a sixth embodiment of the present invention.

FIG. 9 shows an application of the present invention used in a connected form.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Referring to the drawings, the present invention provides a structure of color mixing circuit for LED light, which comprises three primary-color light-emitting chips of R, G, B. The LED light comprises two input terminals and two output terminals, wherein the two input terminals are respectively an input terminal of reverse parallel connection of any two light-emitting chips of the three primary-color light-emitting chips of R, G, B and an anode input terminal of the remaining light-emitting chip and the two output terminals are respectively an output terminal of reverse parallel connection of any two light-emitting chips of the three primary-color light-emitting chips of R, G, B and a cathode output terminal of the remaining light-emitting chip.

When the three primary-color light-emitting chips of R, G, B adopt the above described connection structure, only two integrated circuits (ICs) are needed to respectively control the two parallel connected light-emitting chips and the remaining single light-emitting chip. The number of ICs is reduced by one and synchronous color change of the light-emitting chips can be realized.

Referring to FIG. 3, a connection structure of three primary-color light-emitting chips of R, G, B according to a first embodiment of the present invention is that the two input terminals are respectively an input terminal of parallel connection of an anode of an R primary-color light-emitting chip and a cathode of a G primary-color light-emitting chip and an anode input terminal of a B primary-color light-emitting chip and the two output terminals are respectively an output terminal of parallel connection of a cathode of the R primary-color light-emitting chip and an anode of the G primary-color light-emitting chip and a cathode input terminal of the B primary-color light-emitting chip.

Referring to FIG. 4, a connection structure of three primary-color light-emitting chips of R, G, B according to a second embodiment of the present invention is that the two input terminals are respectively an input terminal of parallel connection of an anode of an R primary-color light-emitting chip and a cathode of a B primary-color light-emitting chip and an anode input terminal of a G primary-color light-emitting chip and the two output terminals are respectively an output terminal of parallel connection of a cathode of the R primary-color light-emitting chip and an anode of the B primary-color light-emitting chip and a cathode input terminal of the G primary-color light-emitting chip.

Referring to FIG. 5, a connection structure of three primary-color light-emitting chips of R, G, B according to a third embodiment of the present invention is that the two input terminals are respectively an input terminal of parallel connection of an anode of a G primary-color light-emitting chip and a cathode of a B primary-color light-emitting chip and an anode input terminal of an R primary-color light-emitting chip and the two output terminals are respectively an output terminal of parallel connection of a cathode of the G primary-color light-emitting chip and an anode of the B primary-color light-emitting chip and a cathode input terminal of the R primary-color light-emitting chip.

Referring to FIG. 6, a connection structure of three primary-color light-emitting chips of R, G, B according to a fourth embodiment of the present invention is that the two input terminals are respectively an input terminal of parallel connection of an anode of a G primary-color light-emitting chip and a cathode of an R primary-color light-emitting chip and an anode input terminal of a B primary-color light-emitting chip and the two output terminals are respectively an output terminal of parallel connection of a cathode of the G primary-color light-emitting chip and an anode of the R primary-color light-emitting chip and a cathode input terminal of the B primary-color light-emitting chip.

Referring to FIG. 7, a connection structure of three primary-color light-emitting chips of R, G, B according to a fifth embodiment of the present invention is that the two input terminals are respectively an input terminal of parallel connection of an anode of a B primary-color light-emitting chip and a cathode of an R primary-color light-emitting chip and an anode input terminal of a G primary-color light-emitting chip and the two output terminals are respectively an output terminal of parallel connection of a cathode of the B primary-color light-emitting chip and an anode of the R primary-color light-emitting chip and a cathode input terminal of the G primary-color light-emitting chip.

Referring to FIG. 8, a connection structure of three primary-color light-emitting chips of R, G, B according to a sixth embodiment of the present invention is that the two input terminals are respectively an input terminal of parallel connection of an anode of a B primary-color light-emitting chip and a cathode of a G primary-color light-emitting chip and an anode input terminal of an R primary-color light-emitting chip and the two output terminals are respectively an output terminal of parallel connection of a cathode of the B primary-color light-emitting chip and an anode of the G primary-color light-emitting chip and a cathode input terminal of the R primary-color light-emitting chip.

FIG. 9 shows an application of the present invention used in a connected form. When the present invention is used to form a light bar or a color light string, IC control chips can be mounted external of the light bar or the color light string for easy replacement and maintenance.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A structure color mixing circuit of LED light, characterized in that the LED light comprises two separate input terminals and two separate output terminals, wherein the two input terminals are respectively an input terminal of reverse parallel connection of any two light-emitting chips of the three primary-color light-emitting chips of R, G, B and an anode input terminal of the remaining single light-emitting chip and the two output terminals are respectively an output terminal of reverse parallel connection of any two light-emitting chips of the three primary-color light-emitting chips of R, G, B and a cathode output terminal of the remaining single light-emitting chip, two integrated circuits being respectively connected to and controlling the reverse parallel connection of an two light-emitting chips and the remaining single light-emitting chip.

2. The structure color mixing circuit of LED light according to claim 1, characterized in that the two input terminals are respectively an input terminal of parallel connection of an anode of an R primary-color light-emitting chip and a cathode of a G primary-color light-emitting chip and an anode input terminal of a B primary-color light-emitting chip and the two output terminals are respectively an output terminal of parallel connection of a cathode of the R primary-color light-emitting chip and an anode of the G primary-color light-emitting chip and a cathode input terminal of the B primary-color light-emitting chip.

3. The structure color mixing circuit of LED light according to claim 1, characterized in that the two input terminals are respectively an input terminal of parallel connection of an anode of an R primary-color light-emitting chip and a cathode of a B primary-color light-emitting chip and an anode input terminal of a G primary-color light-emitting chip and the two output terminals are respectively an output terminal of parallel connection of a cathode of the R primary-color light-emitting chip and an anode of the B primary-color light-emitting chip and a cathode input terminal of the G primary-color light-emitting chip.

4. The structure color mixing circuit of LED light according to claim 1, characterized in that the two input terminals are respectively an input terminal of parallel connection of an anode of a G primary-color light-emitting chip and a cathode of a B primary-color light-emitting chip and an anode input terminal of an R primary-color light-emitting chip and the two output terminals are respectively an output terminal of parallel connection of a cathode of the G primary-color light-emitting chip and an anode of the B primary-color light-emitting chip and a cathode input terminal of the R primary-color light-emitting chip.

5. The structure color mixing circuit of LED light according to claim 1, characterized in that the two input terminals are respectively an input terminal of parallel connection of an anode of a G primary-color light-emitting chip and a cathode of an R primary-color light-emitting chip and an anode input terminal of a B primary-color light-emitting chip and the two output terminals are respectively an output terminal of parallel connection of a cathode of the G primary-color light-emitting chip and an anode of the R primary-color light-emitting chip and a cathode input terminal of the B primary-color light-emitting chip.

6. The structure color mixing circuit of LED light according to claim 1, characterized in that the two input terminals are respectively an input terminal of parallel connection of an anode of a B primary-color light-emitting chip and a cathode of an R primary-color light-emitting chip and an anode input terminal of a G primary-color light-emitting chip and the two output terminals are respectively an output terminal of parallel connection of a cathode of the B primary-color light-emitting chip and an anode of the R primary-color light-emitting chip and a cathode input terminal of the G primary-color light-emitting chip.

7. The structure color mixing circuit of LED light according to claim 1, characterized in that the two input terminals are respectively an input terminal of parallel connection of an anode of a B primary-color light-emitting chip and a cathode of a G primary-color light-emitting chip and an anode input terminal of an R primary-color light-emitting chip and the two output terminals are respectively an output terminal of parallel connection of a cathode of the B primary-color light-emitting chip and an anode of the G primary-color light-emitting chip and a cathode input terminal of the R primary-color light-emitting chip.

* * * * *